US012517428B2

(12) United States Patent
Oh et al.

(10) Patent No.: US 12,517,428 B2
(45) Date of Patent: Jan. 6, 2026

(54) FUNCTIONAL PHOTORESIST AND METHOD OF PATTERNING NANOPARTICLE THIN FILM USING THE SAME

(71) Applicant: Korea University Research and Business Foundation, Seoul (KR)

(72) Inventors: Soong Ju Oh, Seoul (KR); Jun Hyuk Ahn, Seoul (KR); Jung Ho Bae, Gwacheon-si (KR)

(73) Assignee: Korea University Research and Business Foundation, Seoul (KR)

( * ) Notice: Subject to any disclaimer, the term of this patent is extended or adjusted under 35 U.S.C. 154(b) by 678 days.

(21) Appl. No.: 17/892,433

(22) Filed: Aug. 22, 2022

(65) Prior Publication Data

US 2023/0071027 A1    Mar. 9, 2023

(30) Foreign Application Priority Data

Aug. 24, 2021    (KR) .......... 10-2021-0111460

(51) Int. Cl.
*G03F 7/004*        (2006.01)
*G03F 7/022*        (2006.01)
(Continued)

(52) U.S. Cl.
CPC .......... *G03F 7/0045* (2013.01); *G03F 7/0043* (2013.01); *H01L 21/0274* (2013.01); *H10D 99/00* (2025.01); *H10F 71/00* (2025.01); *G03F 7/0226* (2013.01); *G03F 7/0233* (2013.01); *G03F 7/0236* (2013.01); *H10D 62/118* (2025.01); *H10D 62/8603* (2025.01); *H10F 77/127* (2025.01); *H10F 77/162* (2025.01)

(58) Field of Classification Search
CPC .... G03F 7/0226; G03F 7/0233; G03F 7/0236; G03F 7/004; H10F 77/12–1285; H10F 77/1433; H10D 62/118
See application file for complete search history.

(56) References Cited

U.S. PATENT DOCUMENTS

2006/0216636 A1    9/2006 Min et al.
2011/0210351 A1*   9/2011 Kim ............... H10H 29/142
                                              257/89

(Continued)

FOREIGN PATENT DOCUMENTS

KR    10-2006-0101968 A    9/2006
KR    10-2016-0139354 A    12/2016
(Continued)

OTHER PUBLICATIONS

Korean Office Action Issued on Aug. 7, 2023, in Counterpart Korean Patent Application No. 10-2021-0111460 (8 Pages in English, 8 Pages in Korean).

(Continued)

*Primary Examiner* — Jonathan Johnson
*Assistant Examiner* — Anna Malloy
(74) *Attorney, Agent, or Firm* — NSIP Law

(57) ABSTRACT

The functional photoresist for patterning a nanoparticle thin film including nanoparticles on a substate includes: a photoactive compound (PAC); and a functional ligand that is bound to surfaces of the nanoparticles and controls physical properties of the nanoparticles.

11 Claims, 10 Drawing Sheets

+

+

(51) Int. Cl.
   *G03F 7/023*   (2006.01)
   *H01L 21/027*  (2006.01)
   *H10D 62/10*   (2025.01)
   *H10D 62/86*   (2025.01)
   *H10D 99/00*   (2025.01)
   *H10F 71/00*   (2025.01)
   *H10F 77/12*   (2025.01)
   *H10F 77/162*  (2025.01)

(56) References Cited

U.S. PATENT DOCUMENTS

| | | | |
|---|---|---|---|
| 2014/0076847 A1* | 3/2014 | Kim | B21B 45/02 |
| | | | 430/286.1 |
| 2017/0123312 A1* | 5/2017 | Lewis | G03F 7/162 |
| 2020/0127219 A1* | 4/2020 | Chen | H10K 50/115 |
| 2021/0116310 A1 | 4/2021 | Oh et al. | |
| 2021/0311388 A1* | 10/2021 | Lai | G03F 7/0397 |
| 2023/0028673 A1 | 1/2023 | Ho et al. | |

FOREIGN PATENT DOCUMENTS

| | | |
|---|---|---|
| KR | 10-2018-0069535 A | 6/2018 |
| KR | 10-2020-0040671 A | 4/2020 |
| KR | 10-2021-0047115 A | 4/2021 |

OTHER PUBLICATIONS

Korean Notice of Allowance Issued on Jan. 2, 2024, in Counterpart Korean Patent Application No. 10-2021-0111460 (6 Pages in English, 6 Pages in Korean).

* cited by examiner

[FIG. 1]
101 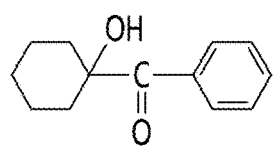 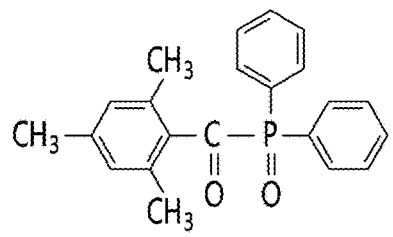 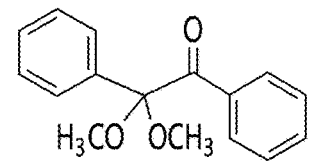
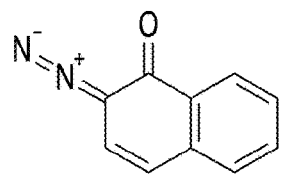
+
102 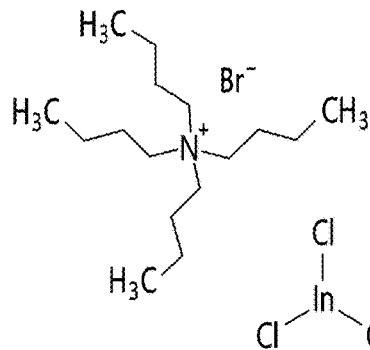 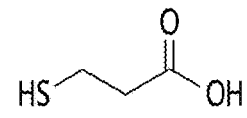
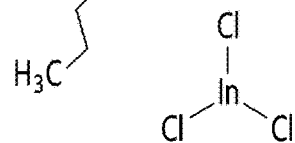 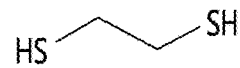
+
103 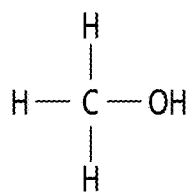 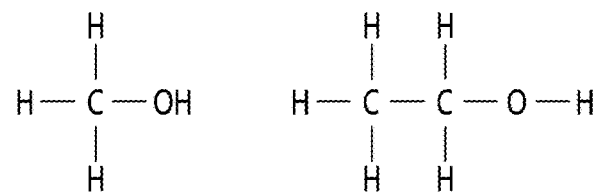

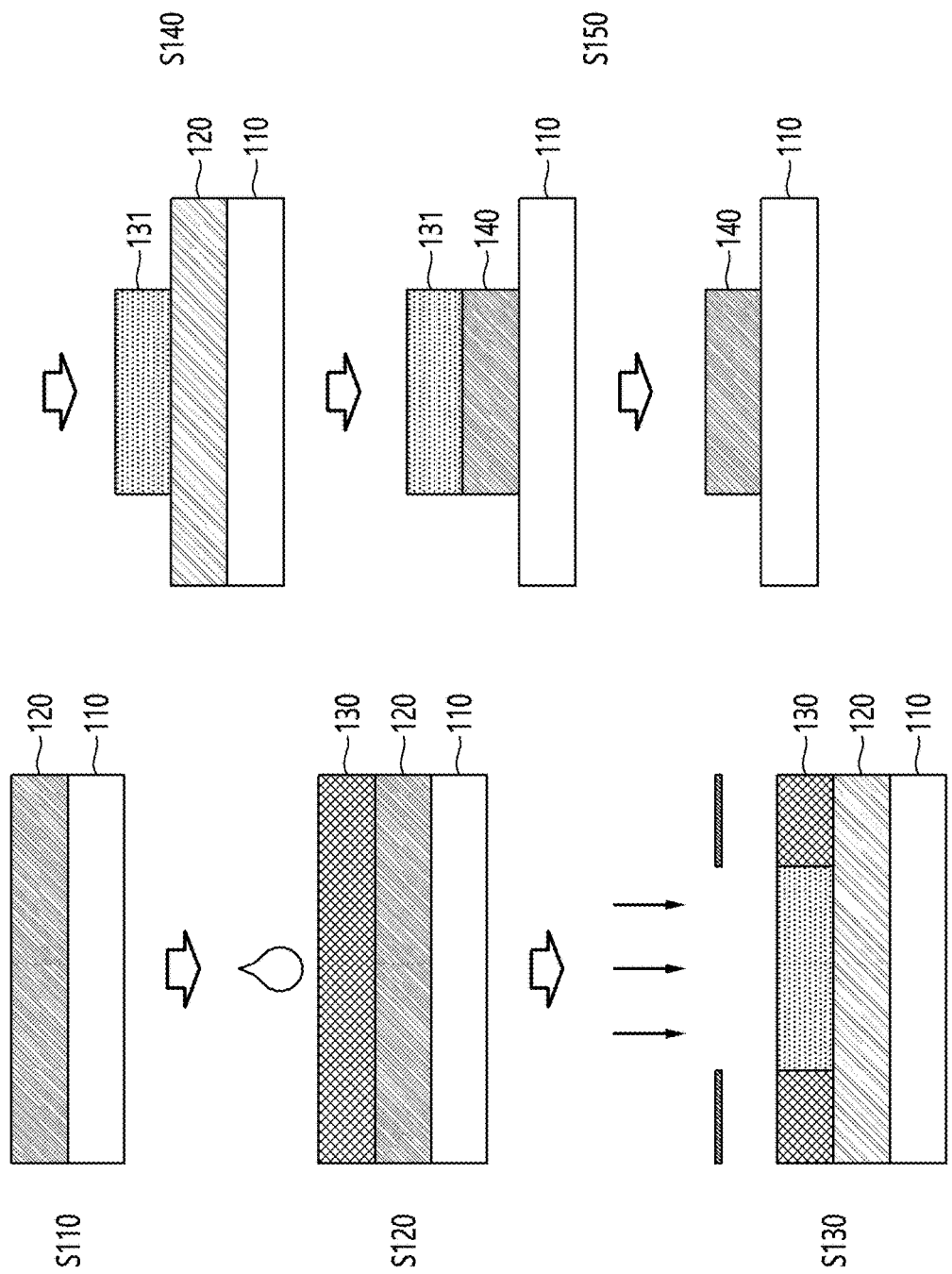

[FIG. 3]
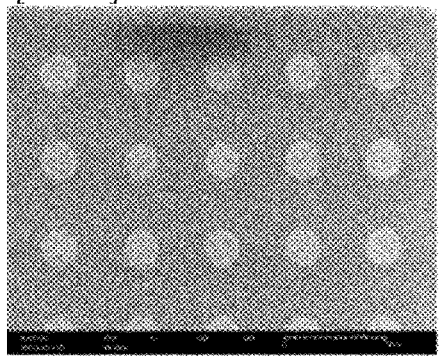
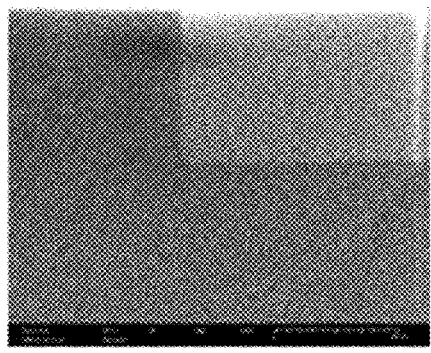
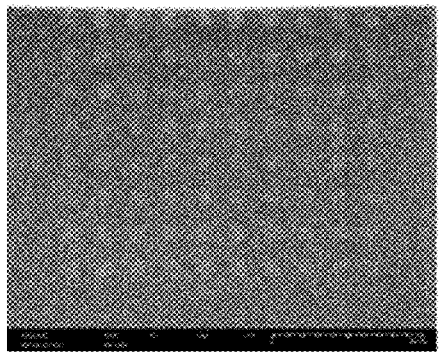
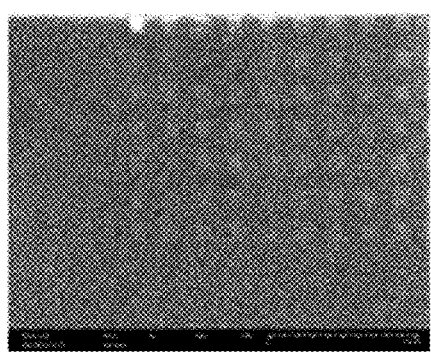

[FIG. 4]
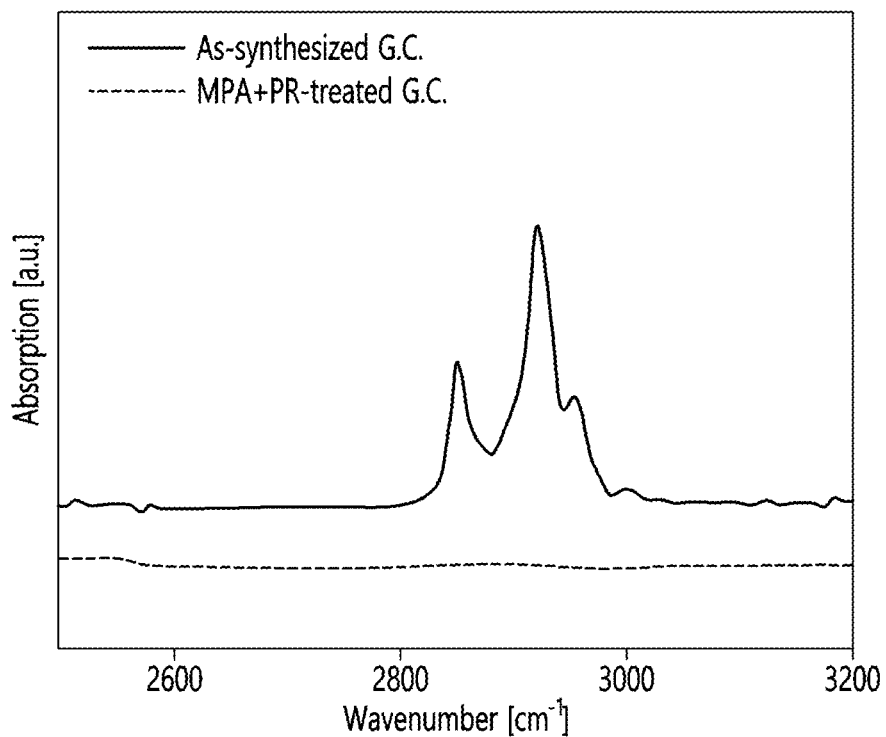
[FIG. 5]
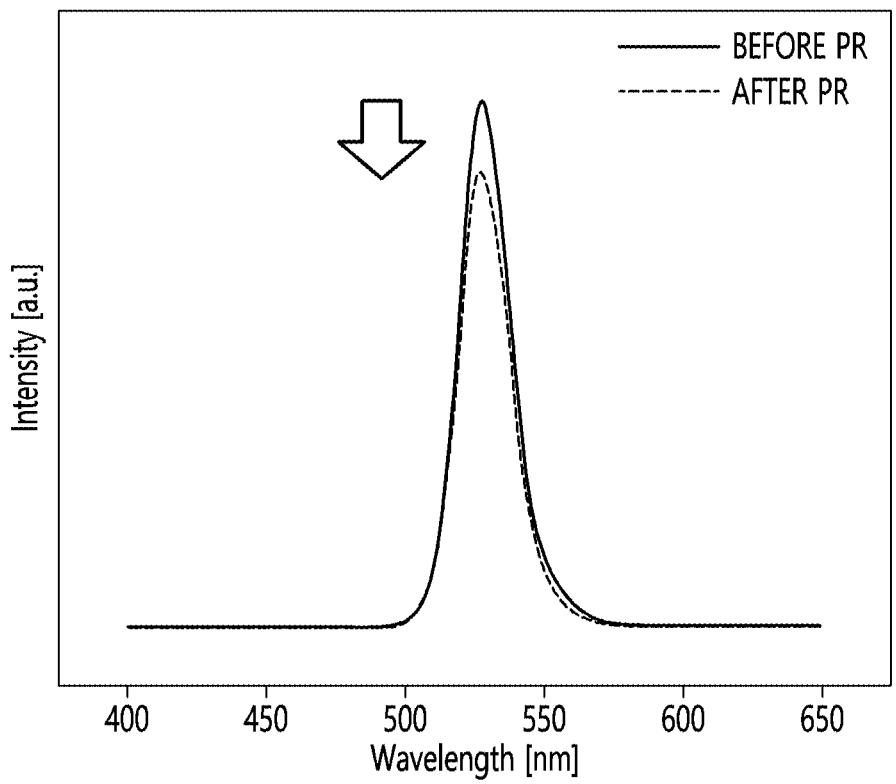

[FIG. 6]
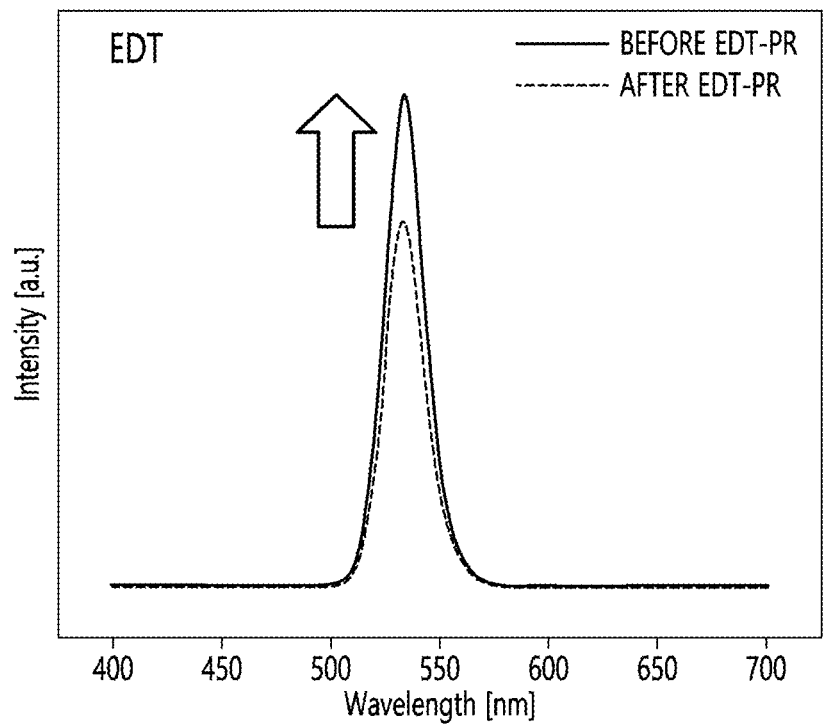
[FIG. 7]
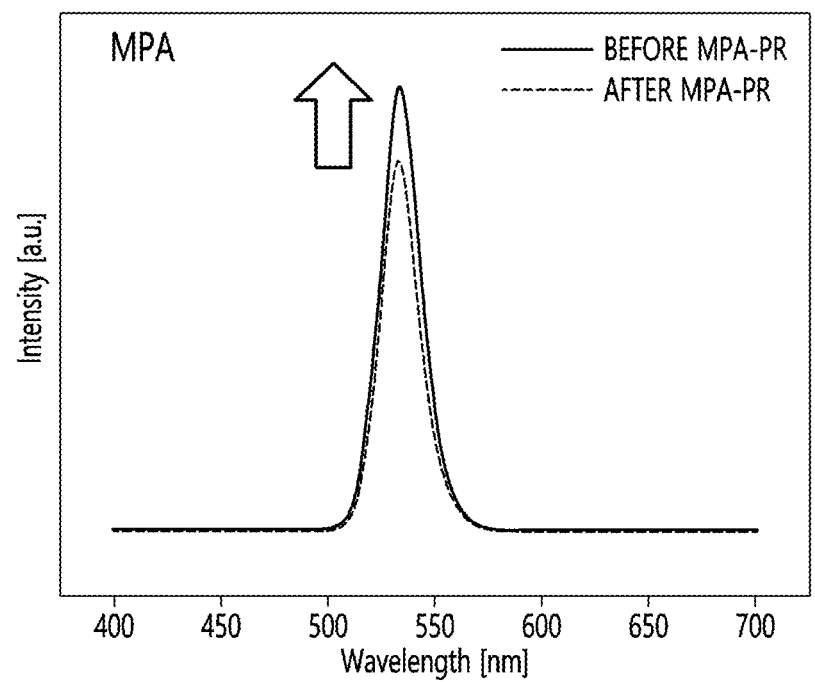

[FIG. 8]
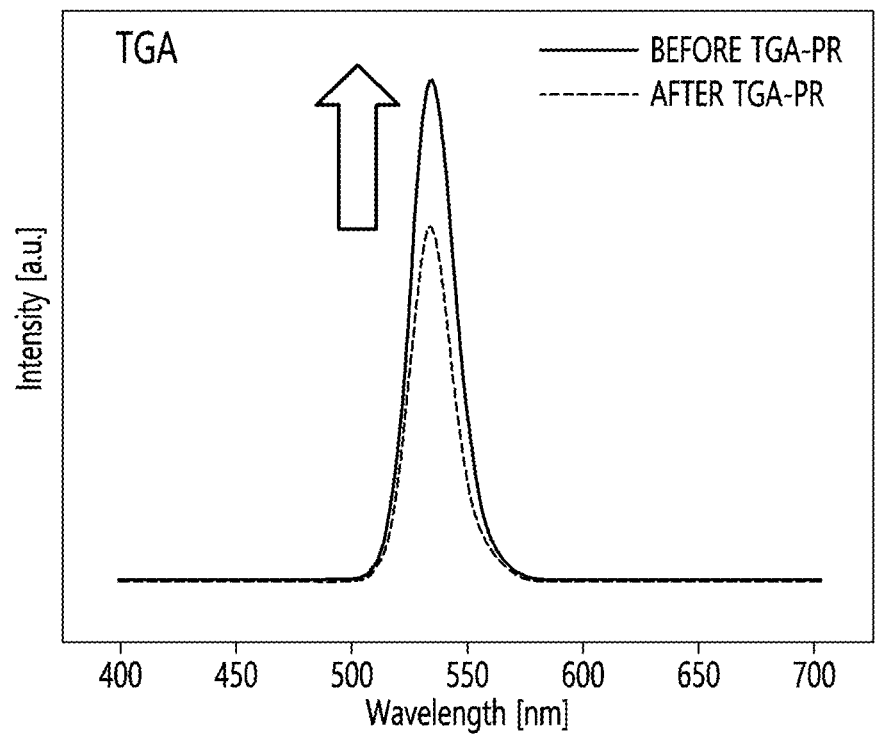
[FIG. 9]
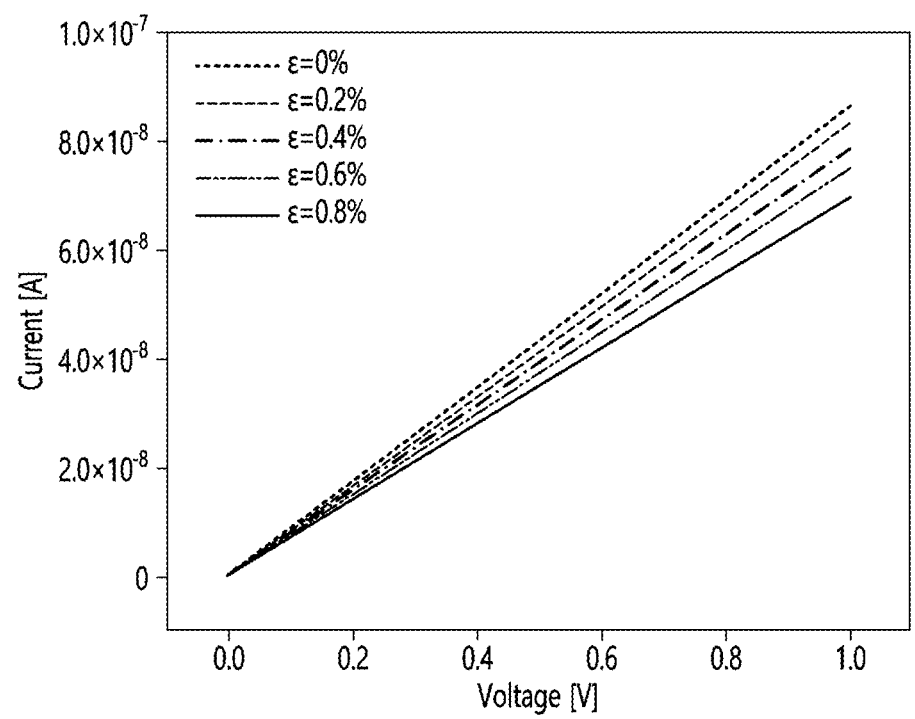

[FIG. 10]
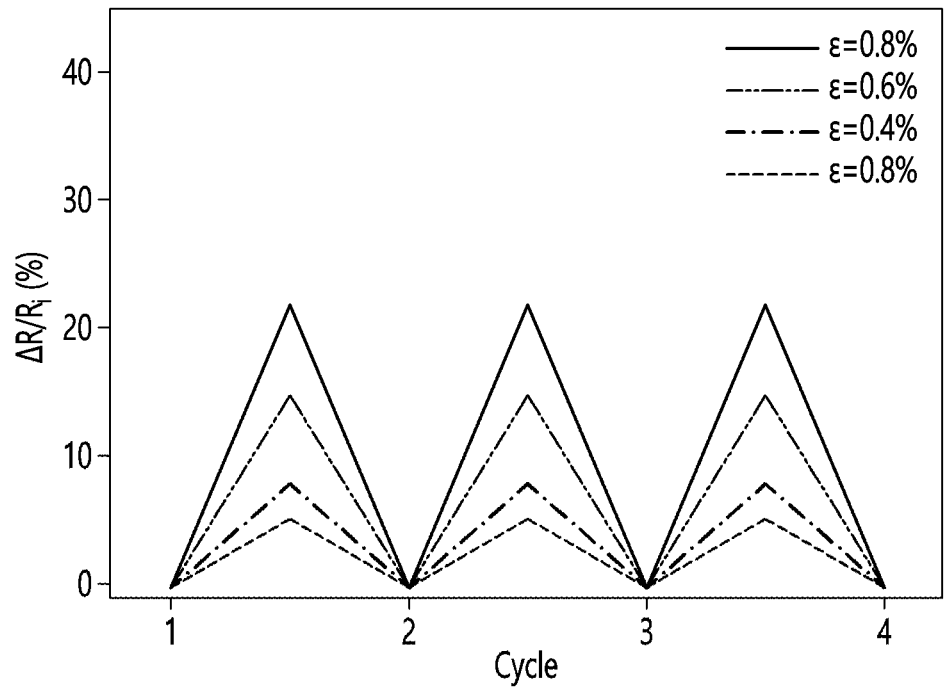
[FIG. 11]
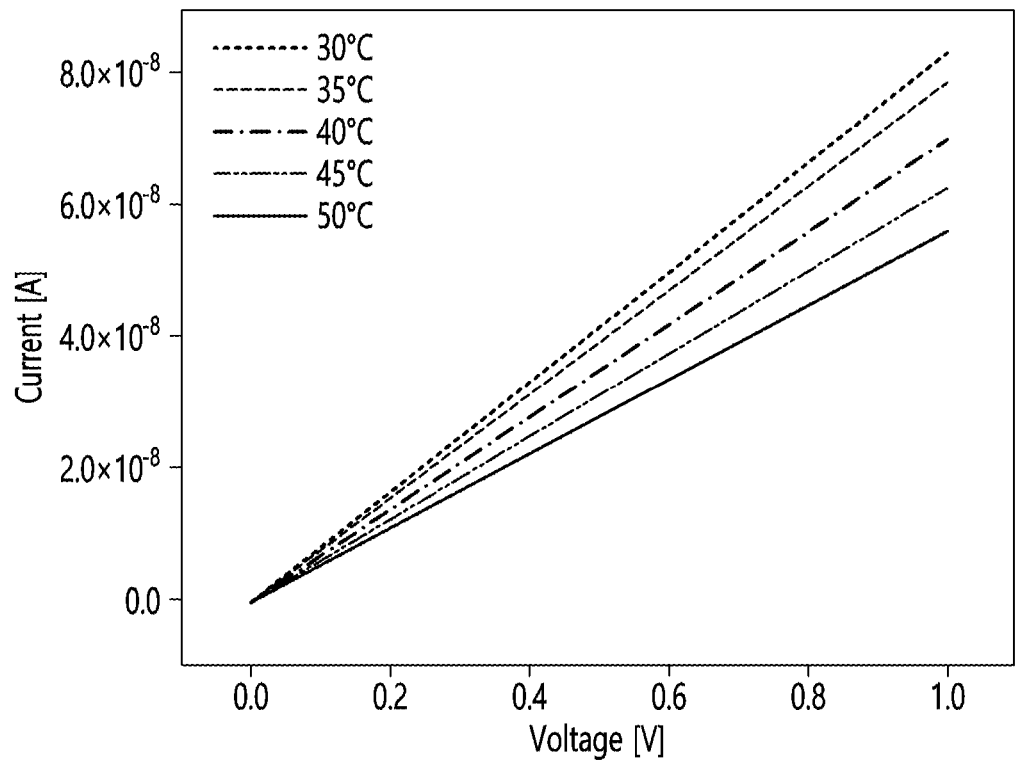

[FIG. 12]
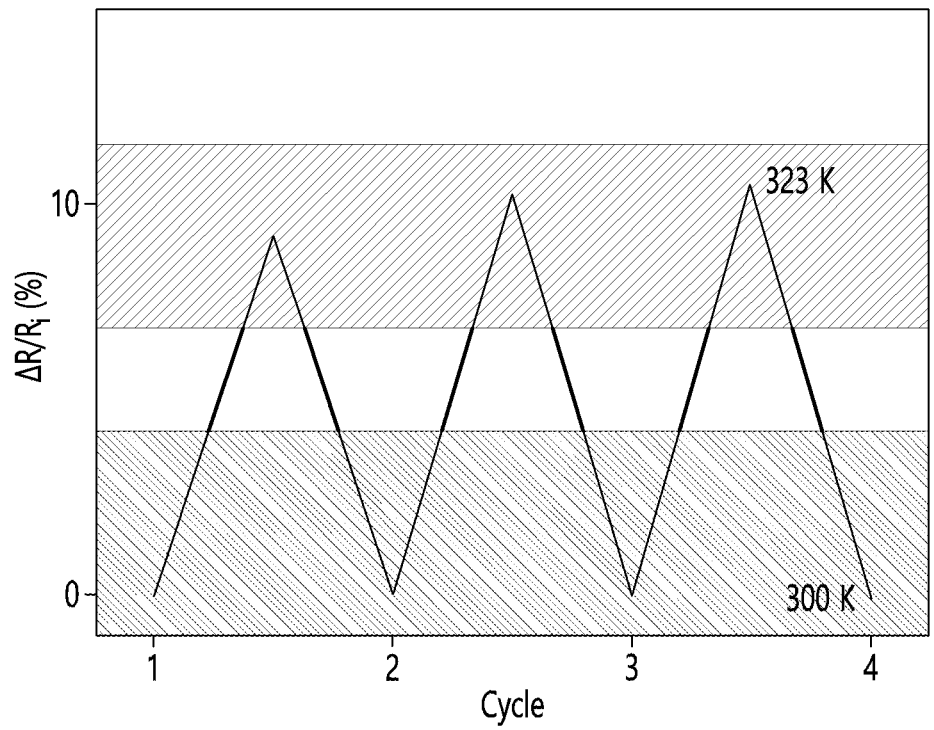
[FIG. 13]
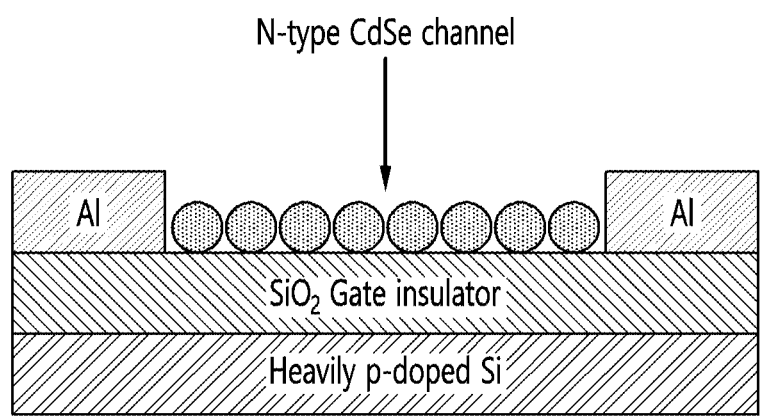

[FIG. 14]
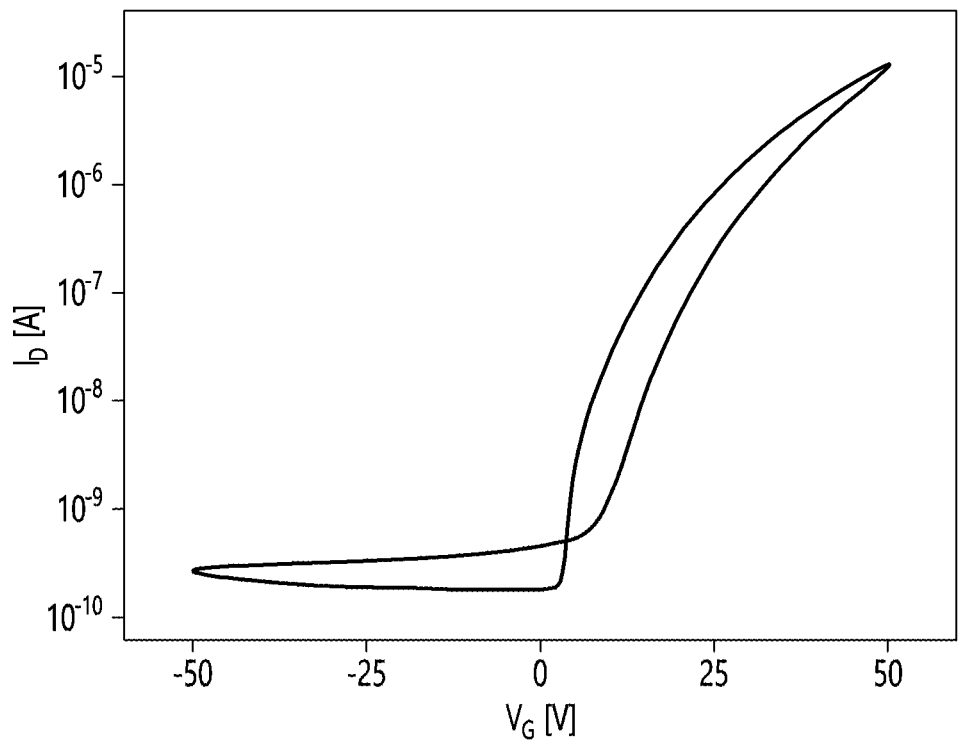
[FIG. 15]
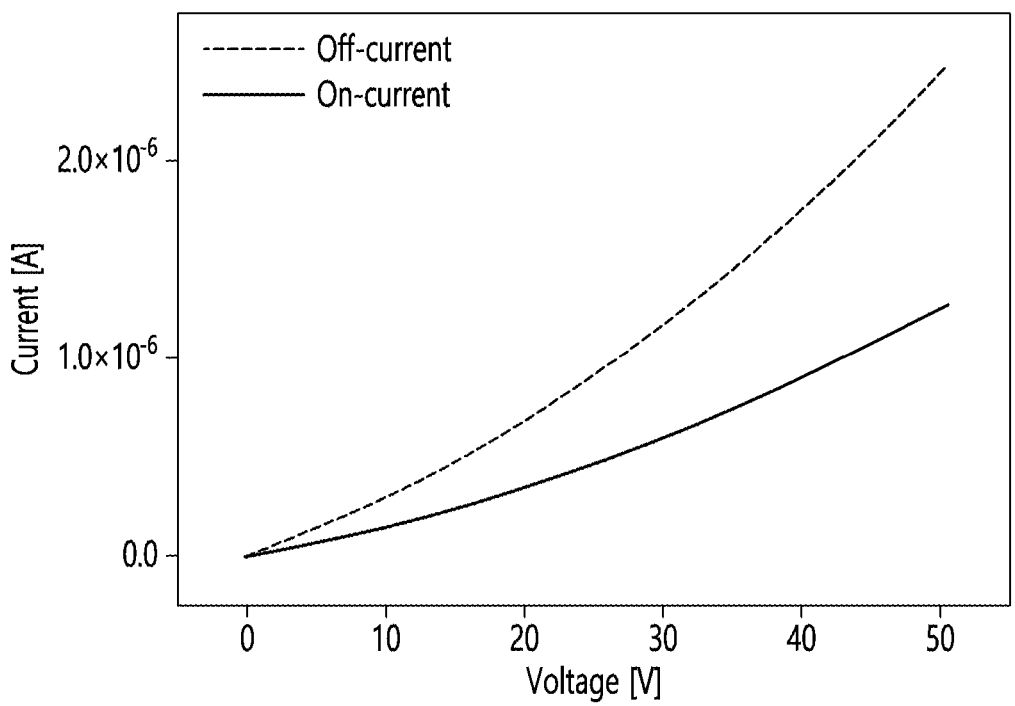

[FIG. 16]
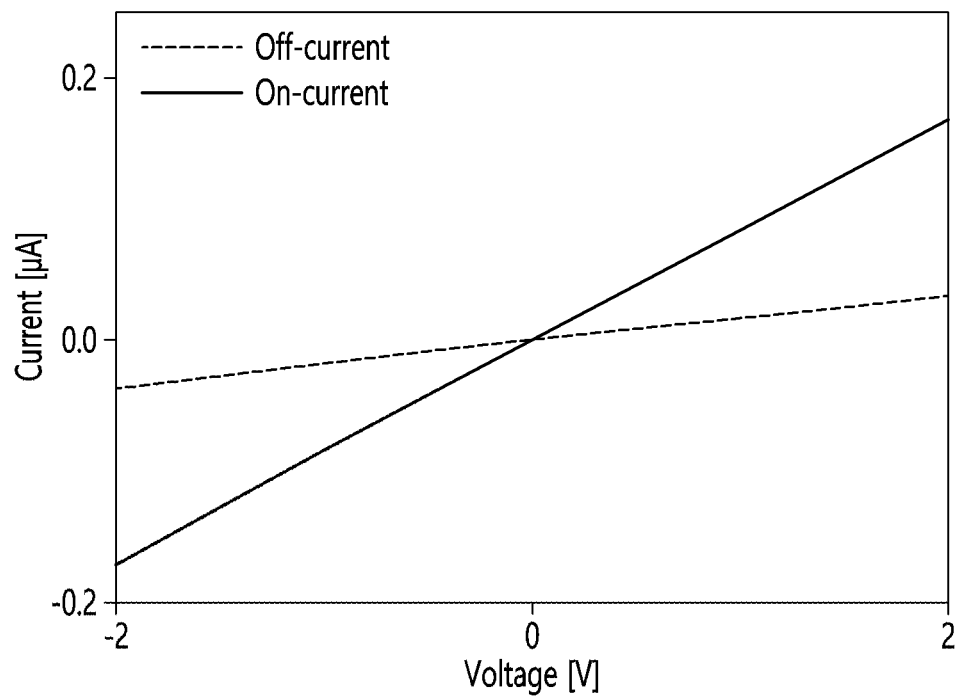

FUNCTIONAL PHOTORESIST AND METHOD OF PATTERNING NANOPARTICLE THIN FILM USING THE SAME

CROSS-REFERENCE TO RELATED APPLICATION

This application claims priority to Korean Patent Application No. 10-2021-0111460, filed on Aug. 24, 2021, in the Korean Intellectual Property Office, the disclosure of which is incorporated herein by reference.

BACKGROUND OF THE DISCLOSURE

Field of the Disclosure

The present disclosure relates to a functional photoresist and a method of patterning a nanoparticle thin film using the same. According to the present disclosure, by using a photoresist containing a functional ligand, a nanoparticle thin film may be patterned, and the physical properties of nanoparticles may be controlled.

Description of the Related Art

As the 4th industry develops, high performance and high integration of wearable and Internet-of-Things (IoT) sensors, flexible displays, and image sensors for autonomous driving are required.

In addition, quantum dots are attracting attention as a material exhibiting high efficiency and performance in the above industrial fields. Since quantum dots show a "High surface-area-to-volume ratio", various physical properties, such as optical, optoelectronic, and electronic properties, can be tuned by surface modifications. This allows for fabrication of various devices such as light-emitting devices (LEDs), transistors, and photodetectors. In addition, application of quantum dots in various application fields such as solar cells, displays, and computing systems is being actively studied.

To realize a high-performance, high-integration device using quantum dots, it is necessary to develop a physical property control process capable of improving the electrical and optical properties of a material and a photolithography process technology capable of miniaturizing a semiconductor material, patterning the semiconductor material into a desired shape, and integrating the semiconductor material.

However, until now, when a device is fabricated in a semiconductor process, a process for controlling the physical properties of a material and a lithography process are separately performed. Thus, process complexity may arise. In addition, since the above two processes are performed under harsh conditions, the physical properties of a material that has been subjected to the previous process may be changed.

In fact, since quantum dots have low oxidative stability and moisture resistance, undesirable reactions readily occur on their surfaces, inducing oxides, structural changes, and changes in surface chemistry under the lithography processes. Indeed, photolithography includes chemical substances such as photoresist and developers and harsh conditions such as UV exposure and other polar solvents, leading to damage on the quantum dot surfaces. In particular, the physical properties of quantum dots are deteriorated due to damage to nanoparticles by chemical substances such as a photoresist and a dispersion solvent used in a photolithography process.

Therefore, to reduce damage to nanoparticles in a photolithography process, a technique for controlling surface properties and a passivation technique are required.

SUMMARY OF THE DISCLOSURE

Therefore, the present disclosure has been made in view of the above problems, and it is an object of the present disclosure to provide a functional photoresist and a method of patterning a nanoparticle thin film using the same. According to the present disclosure, by including a functional ligand in a photoresist, a nanoparticle thin film may be patterned, and at the same time, the physical properties of nanoparticles may be controlled through ligand substitution of nanoparticles (or control of surface chemistry).

It is another object of the present disclosure to provide a functional photoresist and a method of patterning a nanoparticle thin film using the same. According to the present disclosure, by including a functional ligand in a photoresist, a nanoparticle thin film may be patterned, and at the same time, the surfaces of nanoparticles may be passivated.

In accordance with one aspect of the present disclosure, provided is a functional photoresist for patterning a nanoparticle thin film including nanoparticles on a substrate, the functional photoresist including a photoactive compound (PAC); and a functional ligand that is bound to surfaces of the nanoparticles and controls physical properties of the nanoparticles.

The physical properties of the nanoparticles may be electrical properties, and the electrical properties may include at least one of conductivity, bandgap, and free charge concentration.

The physical properties of the nanoparticles may be optical properties, and the optical properties may include at least one of photoluminescence intensity, photoluminescence lifetime, and photoluminescence quantum yield (PLQY).

The nanoparticles may include a surface ligand, and the surface ligand may be substituted with the functional ligand by the functional photoresist.

A distance between the nanoparticles may be adjusted by the functional ligand.

The functional ligand may include an organic ligand, and the organic ligand may include at least one of 3-mercaptopropionic acid (MPA), 1,2-ethanedithiol (EDT), thioglycolic acid, ethylenediamine (EDA), benzenedithiol (BDT), pyridine, methanethiosulfonyl-galactoside (TGA), propanedithiol (PDT), ethylenediamine, and phenylenediamine.

The functional ligand may include an inorganic ligand, and the inorganic ligand may include at least one of sulfur ions ($S^{2-}$), chlorine ions ($Cl^-$), bromine ions ($Br^-$), indium ($In^{3+}$) potassium ($K^+$), sodium ($Na^+$), thiocyanate ions ($SCN^-$), iodine ions ($I^-$), disulfide ions ($HS^-$), tellurium ions ($Te^{2-}$), hydroxide ions ($OH^-$), boric tetrafluoride ions ($BF_4^-$) and hexafluorophosphate ions ($PF_6^-$).

The functional ligand may have a concentration of 100 mM to 500 mM.

The nanoparticles may include at least one of metals, metal oxides, chalcogenides, and quantum dots.

In accordance with another aspect of the present disclosure, provided is a method of patterning a nanoparticle thin film, the method including forming a nanoparticle thin film including nanoparticles on a substrate; coating with the functional photoresist according to claim 1; exposing the functional photoresist used in the coating; developing the exposed functional photoresist to form a functional photoresist pattern; and forming a nanoparticle pattern using the functional photoresist pattern as an etching mask, wherein the functional photoresist includes a functional ligand that is bound to surfaces of the nanoparticles and controls physical properties of the nanoparticles.

The physical properties of the nanoparticles may be electrical properties, and the electrical properties may include at least one of conductivity, bandgap, and free charge concentration.

The physical properties of the nanoparticles may be optical properties, and the optical properties may include at least one of photoluminescence intensity, photoluminescence lifetime, and photoluminescence quantum yield (PLQY).

The nanoparticles may include a surface ligand, and in the coating, the surface ligand may be substituted with the functional ligand by the functional photoresist.

The functional ligand may include an organic ligand, and the organic ligand may include at least one of 3-mercaptopropionic acid (MPA), 1,2-ethanedithiol (EDT), thioglycolic acid, ethylenediamine (EDA), benzenedithiol (BDT), pyridine, methanethiosulfonyl-galactoside (TGA), propanedithiol (PDT), ethylenediamine, and phenylenediamine.

The functional ligand may include an inorganic ligand, and the inorganic ligand may include at least one of sulfur ions ($S^{2-}$), chlorine ions ($Cl^-$), bromine ions ($Br^-$), thiocyanate ions ($SCN^-$), iodine ions ($I^-$), disulfide ions ($HS^-$), tellurium ions ($Te^{2-}$), hydroxide ions ($OH^-$), boric tetrafluoride ions ($BF^{4+}$), and hexafluorophosphate ions ($PF^{6-}$).

BRIEF DESCRIPTION OF THE DRAWINGS

The above and other objects, features and other advantages of the present disclosure will be more clearly understood from the following detailed description taken in conjunction with the accompanying drawings, in which:

FIG. 1 shows the structural formulas of materials used as a photoactive compound, a functional ligand, and a dispersion solvent included in a functional photoresist according to an embodiment of the present disclosure;

FIG. 2 schematically illustrates a process in which a surface ligand is substituted with a functional ligand by a functional photoresist in a step of coating with a functional photoresist in a method of patterning a nanoparticle thin film according to an embodiment of the present disclosure;

FIG. 2 includes cross-sectional views for explaining a method of patterning a nanoparticle thin film according to an embodiment of the present disclosure;

FIG. 3 includes scanning electron microscope (SEM) images of a nanoparticle pattern formed using a functional photoresist according to Example 1-2;

FIG. 4 is a graph showing Fourier transform infrared spectra before (As-synthesized G.C. (As-synthesized giant core-shell)) and after (MPA+PR-treated G.C.) coating with a functional photoresist according to Example 1-2;

FIG. 5 is a graph showing PL intensities before and after coating with a photoresist according to a comparative example, FIG. 6 is a graph showing PL intensities before and after coating with a functional photoresist according to Example 1-1, FIG. 7 is a graph showing PL intensities before and after coating with a functional photoresist according to Example 1-2, and FIG. 8 is a graph showing PL intensities before and after coating with a functional photoresist according to Example 1-3;

FIG. 9 is a graph showing the current-voltage characteristics of a strain gauge sensor according to Example 2-1, and FIG. 10 is a graph showing resistance change cycles;

FIG. 11 is a graph showing the current-voltage characteristics of a temperature sensor according to Example 2-2, and FIG. 12 is a graph showing resistance change cycles;

FIG. 13 schematically illustrates an n-type transistor according to Example 3-1, and FIG. 14 is a graph showing the electronic properties of the n-type transistor according to Example 3-1; and FIG. 15 is a graph showing the current-voltage characteristics of a photodetector (Vis, NIR photodetector) according to Example 3-2 under visible light conditions (Optoelectronic property), and FIG. 16 is a graph showing current-voltage characteristics under near infrared light conditions (Optoelectronic property).

DETAILED DESCRIPTION OF THE DISCLOSURE

The present disclosure will now be described more fully with reference to the accompanying drawings and contents disclosed in the drawings. However, the present disclosure should not be construed as limited to the exemplary embodiments described herein.

The terms used in the present specification are used to explain a specific exemplary embodiment and not to limit the present inventive concept. Thus, the expression of singularity in the present specification includes the expression of plurality unless clearly specified otherwise in context. It will be further understood that the terms "comprise" and/or "comprising", when used in this specification, specify the presence of stated components, steps, operations, and/or elements, but do not preclude the presence or addition of one or more other components, steps, operations, and/or elements thereof.

It should not be understood that arbitrary aspects or designs disclosed in "embodiments", "examples", "aspects", etc. used in the specification are more satisfactory or advantageous than other aspects or designs.

In addition, the expression "or" means "inclusive or" rather than "exclusive or". That is, unless mentioned otherwise or clearly inferred from context, the expression "x uses a or b" means any one of natural inclusive permutations.

In addition, as used in the description of the disclosure and the appended claims, the singular form "a" or "an" is intended to include the plural forms as well, unless context clearly indicates otherwise.

Although terms used in the specification are selected from terms generally used in related technical fields, other terms may be used according to technical development and/or due to change, practices, priorities of technicians, etc. Therefore, it should not be understood that terms used below limit the technical spirit of the present disclosure, and it should be understood that the terms are exemplified to describe embodiments of the present disclosure.

Also, some of the terms used herein may be arbitrarily chosen by the present applicant. In this case, these terms are defined in detail below. Accordingly, the specific terms used herein should be understood based on the unique meanings thereof and the whole context of the present disclosure.

Unless defined otherwise, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In addition, in the following description of the present disclosure, a detailed description of known functions and configurations incorporated herein will be omitted when it may make the subject matter of the present disclosure unclear. The terms used in the specification are defined in consideration of functions used in the present disclosure, and can be changed according to the intent or conventionally used methods of clients, operators, and users. Accordingly, definitions of the terms should be understood on the basis of the entire description of the present specification.

FIG. 1 shows the structural formulas of materials used as a photoactive compound, a functional ligand, and a dispersion solvent included in a functional photoresist according to an embodiment of the present disclosure.

The functional photoresist according to an embodiment of the present disclosure is a functional photoresist for patterning a nanoparticle thin film including nanoparticles on a substate. The functional photoresist includes a photoactive compound (PAC) 101 and a functional ligand 102 that binds to the surfaces of nanoparticles and controls the physical properties of the nanoparticles.

Accordingly, in the case of the functional photoresist according to an embodiment of the present disclosure, by including a functional ligand in a photoresist, a nanoparticle thin film may be patterned, and at the same time, ligand substitution or surface chemistry of nanoparticles may be controlled to control the physical properties of the nanoparticles. In addition, the surfaces of the nanoparticles may be passivated.

First, the functional photoresist according to an embodiment of the present disclosure includes the photoactive compound (PAC) 101.

The photoactive compound (PAC) 101 refers to a compound that is reactive when exposed to light. In the present disclosure, materials widely used as a photoactive compound in the art may be used as the photoactive compound (PAC) 101, without particular limitation. Preferably, the photoactive compound (PAC) 101 includes diazonaphthoquinone (DNQ)-based compounds.

The content of the photoactive compound (PAC) 101 is not particularly limited. When the content of the photoactive compound (PAC) 101 is too small, after exposure to ultraviolet light, the functional photoresist does not develop properly in a developer. Thus, the content of the photoactive compound (PAC) 101 may be similar to the content of the photoactive compound (PAC) 101 included in a conventional photoresist.

For example, the content of the photoactive compound (PAC) 101 may be 10 ml.

The functional photoresist according to an embodiment of the present disclosure includes the functional ligand 102, and the functional ligand 102 is bound to the surfaces of nanoparticles to modify the surfaces of the nanoparticles to control the physical properties of the nanoparticles.

The physical properties of the nanoparticles may include at least one of electrical properties, electronic properties, electromechanical properties, electro-thermal properties, optical properties and optoelectronic properties.

More specifically, the functional ligand 102 may control the electrical properties of nanoparticles. In this case, the electrical properties may include at least one of conductivity, bandgap, and free charge concentration.

Accordingly, the functional ligand 102 included in the functional photoresist is bound (substitution) to the surfaces of nanoparticles. In the case of a metal nanoparticle thin film, the conductivity of metal nanoparticles may be improved, and the bandgap of semiconductor nanoparticles may be controlled. In addition, free charge concentration in a conduction band may be increased due to formation of an extrinsic semiconductor (semiconductor whose properties are determined by addition of impurities).

For example, when an inorganic ligand such as TBAB or TBAI is used as the functional ligand 102, due to the short length of the inorganic ligand, the distance between nanoparticles is shortened to facilitate electron movement, thereby improving conductivity.

In addition, when an inorganic ligand such as $InCl_3$ is used as the functional ligand 102, the inorganic ligand may be bound to the surfaces of nanoparticles for ion doping.

More specifically, indium (In) has been known as an effective n-type dopant for a CdSe thin film fabricated as a field effect transistor (FET). For indium (In) doping, an expensive, complicated, or time-consuming process such as thermal deposition or synthesis of indium (In) nanoparticles (NC) on a CdSe nanoparticle thin film was required. However, in the functional photoresist according to an embodiment of the present disclosure, by performing patterning using a functional photoresist (PR) including an indium (In) halide ligand, passivation and charge transfer using halide anions may be improved, and doping is possible through indium (In) as cations.

Accordingly, through a simple process of applying a functional photoresist (PR) on a CdSe thin film, an FET device having high electron mobility may be obtained through ligand substitution and indium (In) doping.

Accordingly, the functional ligand 102 may include an inorganic ligand, and the inorganic ligand may include at least one of sulfur ions ($S^{2-}$), chlorine ions ($Cl^-$), bromine ions ($Br^-$), thiocyanate ions ($SCN^-$), iodine ions ($I^-$), disulfide ions ($HS^-$), tellurium ions ($Te^{2-}$), hydroxide ions ($OH^-$), boric tetrafluoride ions ($BF_4^-$), and hexafluorophosphate ions ($PF_6^-$). Preferably, the inorganic ligand includes at least one of $InCl_3$, tetrabutyl ammonium chloride (TBAC), tetrabutyl ammonium iodide (TBAI), and tetrabutyl ammonium bromide (TBAB).

In addition, the functional ligand 102 may control the optical properties of the nanoparticles, and the optical properties may include at least one of photoluminescence intensity, photoluminescence lifetime, and photoluminescence quantum yield (PLQY).

More specifically, indexes for evaluating the optical properties of nanoparticles (e.g., quantum dots) include photoluminescence properties of absorbing light with energy greater than a bandgap and re-emitting light corresponding to the bandgap, photoluminescence lifetime indicating duration of photoluminescence after receiving light, photoluminescence quantum yield (PLQY) representing the number of emitted photons versus the number of absorbed photons, and the like.

For example, an organic ligand including a thiol group may be used as the functional ligand 102. Since a thiol group has a property of strongly binding to the surfaces of the nanoparticles, the organic ligand including a thiol group bonded to the surfaces of nanoparticles (e.g., quantum dots) may protect the surfaces of the nanoparticles (surface passivation), thereby preventing deterioration of the above-described optical properties.

In addition, when the functional photoresist is used, a vacancy serving as a trap site in a bandgap of the surface of nanoparticles (e.g., quantum dots) is passivated by the substituted functional ligand, which reduces the number of the trap sites. As a result, by reducing non-luminescent coupling of excitons, at least one of the optical properties (e.g., photoluminescence intensity and photoluminescence lifetime) of the nanoparticles may be increased.

Accordingly, the functional ligand may include an organic ligand, and the organic ligand may include at least one of 3-mercaptopropionic acid (MPA), 1,2-ethanedithiol (EDT), thioglycolic acid, ethylenediamine (EDA), benzenedithiol (BDT), pyridine, methanethiosulfonyl-galactoside (TGA), propanedithiol (PDT), ethylenediamine, and phenylenediamine. In addition, when the ligand length of the organic ligand is shorter than that of the surface ligand, the organic ligand may include 1 to 3 carbon chains.

In a total content of the final composition, the functional ligand 102 may be included in a concentration of 100 mM to 500 mM. When the concentration of the functional ligand 102 is less than 100 mM, the surface ligand bound to the surface of the nanoparticles may not be effectively replaced with the functional ligand 102 of the functional photoresist. When the concentration of the functional ligand 102 exceeds 500 mM, as reaction is accelerated, agglomeration between the nanoparticles may occur, and eventually, a nanoparticle thin film may be peeled off from a substrate.

According to an embodiment, when the surface ligands are included in the surfaces of the nanoparticles, a nanoparticle thin film including the nanoparticles surrounded by the surface ligands is coated with the functional photoresist according to an embodiment of the present disclosure, the surface ligand of the surfaces of the nanoparticles is substituted with the functional ligand 102 included in the functional photoresist, and the functional ligand 102 is attached to the surfaces of the nanoparticles.

Surface ligands control the shape and size of nanoparticles during nanoparticle synthesis. In addition, the surface ligands surround the nanoparticles, allowing the nanoparticles to be dispersed like ink in a synthesis solvent. In addition, the repulsive force between the surface ligands may prevent the nanoparticles from aggregating and precipitating.

The surface ligand surrounding the surface of the nanoparticle may include 8 to 18 carbon chains. For example, the surface ligand may include at least one of trioctylphosphine, trioctylphosphine oxide, oleic acid, and oleylamine.

Accordingly, the distance between the nanoparticles may be adjusted by the functional ligand 102 included in the functional photoresist according to an embodiment of the present disclosure.

The functional photoresist according to an embodiment of the present disclosure may further include a dispersion solvent 103. The dispersion solvent 103 may dissolve the functional ligand 102 (particularly, a solid inorganic ligand) and serve as a surfactant to well disperse the functional ligand 102 in the functional photoresist.

In addition, the dispersion solvent 103 may be a dispersion solvent including a hydroxyl group. In this case, since the hydroxyl group is polar, the dispersion solvent is capable of dissolving the functional ligand 102. Accordingly, the dispersion solvent serves as a surfactant to allow the functional ligand 102 to be well dispersed in the functional photoresist, and thus the functional ligand may be well mixed with the components of the photoresist by the dispersion solvent.

For example, the dispersion solvent 103 may include at least one of methanol, ethanol, isopropyl alcohol, amyl alcohol, 4-methyl-2-pentanol, cyclohexanol, 3,3,5-trimethylcyclohexanol, furfuryl alcohol, benzyl alcohol, diacetone alcohol, ethylene glycol, propylene glycol, diethylene glycol, dipropylene glycol, triethylene glycol, and tripropylene glycol.

In a total content of the final composition, the dispersion solvent 103 may be included in an amount less than 10%, preferably an amount of 0.1% to 10%.

As the proportion of the dispersion solvent increases, the viscosity of the functional photoresist according to an embodiment of the present disclosure decreases. As a result, during spin coating, the thickness of the functional photoresist is reduced, and a functional photoresist thin film is not properly formed on a substrate. Accordingly, a problem may occur during a photolithography process. In addition, when developing after exposure, overdevelopment may occur, resolution may be reduced due to dissolution in a developer, and a target pattern may not be formed.

The functional photoresist according to an embodiment of the present disclosure may further include a polymer resin. For example, the polymer resin may be a novolac resin, the novolac resin is alkali-soluble, and a conventional novolac resin used in conventional photoresists may be used. For example, the novolac resin may be obtained by polycondensation of a phenol-based compound and an aldehyde-based compound or a ketone-based compound in the presence of an acid catalyst. For example, as the novolac resin, a novolac resin synthesized using meta-Cresol alone, a novolac resin synthesized using para-Cresol alone, a novolac resin synthesized using resorcinol, a novolac resin prepared by reacting salicylic aldehyde with benzyl aldehyde, and a novolac resin prepared by mixing meta-Cresol, para-Cresol, resorcinol, and the like may be used.

The content of the polymer resin is not particularly limited and may be similar to the content of a polymer resin included in a conventional photoresist.

The functional photoresist according to an embodiment of the present disclosure may further include an organic solvent. Organic solvents used in conventional photoresists may be used. For example, the organic solvent may include at least one of butyl acetate, amyl acetate, cyclohexyl acetate, 3-methoxybutyl acetate, methyl ethyl ketone, methyl amyl ketone, cyclohexanone, cyclopentanone, ethyl-3-ethoxy propanoate, methyl-3-ethoxy propanoate, methyl-3-methoxy propanoate, methyl acetoacetate, ethyl acetoacetate, diacetone alcohol, methyl pivalate, ethyl pivalate, propylene glycol monomethyl ether, propylene glycol monoethyl ether, propylene glycol monomethyl ether propanoate, propylene glycol monoethyl ether propanoate, ethylene glycol monomethyl ether, ethylene glycol monoethyl ether, diethylene glycol monomethyl ether, diethylene glycol monoethyl ether, 3-methyl-3-methoxybutanol, N-methylpyrrolidone, dimethyl sulfoxide, gamma-butyrolactone, propylene glycol methyl ether acetate, propylene glycol ethyl ether acetate, propylene glycol propyl ether acetate, methyl lactate, ethyl lactate, propyl lactate, tetramethylene sulfone, propylene glycol dimethyl ether, dipropylene glycol dimethyl ether, ethylene glycol dimethyl ether or diethylene glycol dimethyl ether, and gamma-butyrolactone.

The content of the organic solvent is not particularly limited and may be similar to the content of an organic solvent included in a conventional photoresist.

According to an embodiment, the functional photoresist according to an embodiment of the present disclosure may be prepared using a simple method of adding the functional ligand 102 and the dispersion solvent 103 to a commonly used photoresist. By using the functional photoresist, a nanoparticle thin film may be patterned, and at the same time, the physical properties of nanoparticles may be controlled.

When adding the functional ligand 102 and the dispersion solvent 103 to the commonly used photoresist, based on a total volume of the final composition, a dispersion solution (containing the functional ligand in a concentration of 100 mM to 500 mM) including the functional ligand 102 and the dispersion solvent 103 may be included in an amount less than 10 v/v %, and the photoresist may be included in an amount of 90 v/v % or more.

Hereinafter, the functional photoresist including the functional ligand will be described in more detail with reference to a method of patterning a nanoparticle thin film according to an embodiment of the present disclosure.

FIG. 2 includes cross-sectional views for explaining a method of patterning a nanoparticle thin film according to an embodiment of the present disclosure.

The method of patterning a nanoparticle thin film according to an embodiment of the present disclosure includes step S110 of forming a nanoparticle thin film 120 including nanoparticles on a substrate 110, step S120 of coating with a functional photoresist 130 according to an embodiment of the present disclosure, step S130 of exposing the functional photoresist 130 used in the coating, step S140 of developing the exposed functional photoresist 130 to form a functional photoresist pattern 131, and step S150 of forming a nanoparticle pattern 140 using the functional photoresist pattern 131 as an etching mask.

Accordingly, according to the method of patterning a nanoparticle thin film according to an embodiment of the present disclosure, by using the functional photoresist 130 obtained by including a functional ligand in a photoresist, the nanoparticle thin film 120 may be patterned. At the same time, ligand substitution or surface chemistry of nanoparticles may be controlled to control the physical properties of the nanoparticles, and the surfaces of the nanoparticles may be passivated.

The method of patterning a nanoparticle thin film according to an embodiment of the present disclosure includes step S110 of forming the nanoparticle thin film 120 including nanoparticles on the substrate 110.

The substrate 110 may include at least one of glass, quartz, silicon, and plastic. For example, the plastic substrate may be flexible or bendable.

For example, the flexible substrate may include at least one of polydimethylsiloxane (PDMS), silicon rubber, polyurethane (PU), polyimide (PI), polyethyleneterephthalate (PET), polyethylene naphthalate (PEN), epoxy, and Teflon.

The substrate 110 may be simply formed of the substrate 110, or one or more layers may be formed on the substrate 110.

The nanoparticle thin film 120 may include nanoparticles, and the nanoparticles may include at least one of metals, metal oxides, chalcogenides, and quantum dots.

When the nanoparticle thin film 120 includes metal nanoparticles, in the case of silver nanoparticles, by using the functional photoresist 130, the distance between the silver nanoparticles may be reduced by substituting a long oleic acid ligand (surface ligand) with a short organic ligand or a halide-based inorganic ligand (functional ligand). Accordingly, flow of current through the silver nanoparticles is facilitated, thereby reducing resistance, and increasing conductivity. Accordingly, by forming the silver nanoparticle thin film 120 that has undergone a substitution process on the flexible substate 110, a strain sensor or a temperature sensor may be manufactured.

The metal nanoparticles may include at least one of silver (Ag), copper (Cu), aluminum (Al), gold (Au), platinum (Pt), nickel (Ni), and titanium (Ti), preferably, silver (Ag).

When the nanoparticle thin film 120 includes metal oxide nanoparticles, by using the functional photoresist 130, the functional ligand may bind to the nanoparticle surface to fill the oxygen vacancies contained in the metal oxide, which increases the electron carrier concentration. Accordingly, the thin film may be used as a channel of an n-type thin film transistor.

The metal oxide nanoparticles may include at least one of titanium oxide, tin oxide, zinc oxide, tungsten oxide, zirconium oxide, hafnium oxide, strontium oxide, indium oxide, cerium oxide, yttrium oxide, lanthanum oxide, vanadium oxide, niobium oxide, aluminum oxide, tantalum oxide, indium tin oxide (ITO), indium zinc oxide (IZO), aluminum zinc oxide (AZO), and fluorine tin oxide (FTO).

When the nanoparticle thin film 120 includes chalcogenide nanoparticles, in the case of CdSe nanoparticles, by using the functional photoresist 130, Indium (In) doping may be performed using the functional photoresist 130 including an indium (In) halide functional ligand. More specifically, by applying the functional photoresist 130 onto the CdSe nanoparticle thin film 120, through ligand substitution and In doping, the thin film may be used as an FET device, thereby obtaining high charge mobility. In addition, by reducing the distance between the particles, charges excited by light may easily escape toward an electrode, thereby increasing on-current and increasing the responsivity of a photodetector.

Chalcogenide nanoparticles may have a network structure formed by covalent bonding of sulfur (S), selenium (Se), tellurium (Te), or a combination thereof and may be a lone-pair semiconductor in which a lone-pair band occupies the uppermost part of a valence band.

For example, the chalcogenide may be a metal sulfide, a metal selenide, and a metal telluride. Specifically, the chalcogenide may include at least one of Cu sulfide, Ag sulfide, Au sulfide, Zn sulfide, Cd sulfide, Hg sulfide, Ge sulfide, Sn sulfide, Cu selenide, Ag selenide, Au selenide, Zn selenide, Cd selenide, Hg selenide, Ge selenide, Sn selenide, Cu telluride, Ag telluride, Au telluride, Zn telluride, Cd telluride, Hg telluride, Ge telluride, and Sn telluride.

When the nanoparticle thin film 120 includes quantum dots, by substituting quantum dots with an organic ligand including a thiol group or passivating the quantum dots using the functional photoresist 130, unbound atoms and defects on the surfaces of the quantum dots may be reduced, thereby reducing trap sites in a semiconductor bandgap. Accordingly, the photoluminescence properties of the quantum dots may be improved, and the photoluminescence time of the quantum dots may be increased. Thus, by using the functional photoresist 130, a quantum dot pattern 140 may be implemented, and color filters and LEDs exhibiting excellent luminous efficiency may be manufactured.

The quantum dots may include II-VI semiconductor compounds, III-V semiconductor compounds, I-III-VI semiconductor compounds, IV-VI semiconductor compounds, or mixtures thereof. The quantum dots may include at least one of CdS, CdSe, CdTe, ZnS, ZnSe, ZnTe, ZnO, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe; GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InNP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb; SnS, SnSe, SnTe, PbS, PbSe, PbTe, SnSeS, SnSeTe, SnSTe, PbSeS, PbSeTe, PbSTe, SnPbS, SnPbSe, SnPbTe, SnPbSSe, SnPbSeTe, SnPbSTe; Si, Ge, SiC, and SiGe, without being limited thereto. In some cases, a mixture of two or more of the listed quantum dots may be used. For example, a quantum dot mixture obtained by simply mixing two or more types of quantum dots; a mixed crystal in which two or more compound crystals are partially divided in the same crystal, like a crystal having a core-shell structure or a crystal having a gradient structure; or two or more nanocrystalline compounds may be used. For example, the quantum dot may have a core structure that allows holes to easily escape to the outside or a core/shell structure including a core and a shell covering the core.

The core may include II-VI semiconductor compounds, III-V semiconductor compounds, I-III-VI semiconductor compounds, IV-VI semiconductor compounds, or mixtures thereof.

Preferably, the core includes at least one of CdS, CdSe, CdTe, ZnS, ZnSe, ZnTe, HgS, HgSe, HgTe, GaN, GaP, GaAs, InP, InAs, $CuInS_2$, $CuInSe_2$, $CuInTe_2$, PbS, PbSe, and PbTe, without being limited thereto. The shell may include at least one of CdSe, ZnSe, ZnS, ZnTe, CdTe, PbS, TiO, SrSe, and HgSe, without being limited thereto.

According to an embodiment, surface ligands may be included in the surfaces of the nanoparticles, and the surface ligands control the shape and size of nanoparticles during nanoparticle synthesis. In addition, the surface ligands surround the nanoparticles, allowing the nanoparticles to be dispersed like ink in a synthesis solvent. In addition, the repulsive force between the surface ligands may prevent the nanoparticles from aggregating and precipitating.

The surface ligand surrounding the surface of the nanoparticle may include 8 to 18 carbon chains. For example, the surface ligand may include at least one of trioctylphosphine, trioctylphosphine oxide, oleic acid, and oleylamine.

The nanoparticle thin film 120 may be formed by at least one of spin coating, flexible coating, roll coating, slit and spin coating, slit coating, spray coating, roll to roll coating, bar coating, dip coating, casting, die coating, blade coating, gravure coating, doctor coating, vacuum deposition, chemical vapor deposition, physical vapor deposition, atomic layer deposition, metal organic chemical vapor deposition, plasma-enhanced chemical vapor deposition, molecular beam epitaxy, hydride vapor phase epitaxy, and sputtering.

The method of patterning a nanoparticle thin film according to an embodiment of the present disclosure includes step S120 of coating with the functional photoresist 130 according to an embodiment of the present disclosure.

Since the functional photoresist 130 according to an embodiment of the present disclosure includes the same components as described above, description of the same components will be omitted.

The functional photoresist 130 may include a functional ligand, and the functional ligand may be bound to the surfaces of nanoparticles to modify the surfaces of the nanoparticles, thereby controlling the physical properties of the nanoparticles.

Coating with the functional photoresist 130 may be performed using at least one of spin coating, flexible coating, roll coating, slit and spin coating, slit coating, spray coating, roll to roll coating, bar coating, dip coating, casting, die coating, blade coating, gravure coating, and doctor coating.

In conventional photolithography, a photoresist pattern 131 is formed through photoresist coating, exposure, and development, and then a patterning process of forming the nanoparticle pattern 140 by etching is performed. Then, a ligand substitution process for controlling the physical properties of the nanoparticle pattern 140 is performed separately. However, in the case of the method of patterning a nanoparticle thin film according to an embodiment of the present disclosure, by including a functional ligand in the functional photoresist 130, through a process of coating a nanoparticle thin film 110 with the functional photoresist 130, the functional ligand is bound to the surfaces of the nanoparticles. Thus, the electrical/optical properties of the nanoparticles may be controlled, and at the same time, patterning may be performed.

In addition, in the case of nanoparticles that are not passivated with a functional ligand, atoms not bonded to the surfaces of the nanoparticles are exposed, and these atoms are oxidized by reacting with oxygen in the air or exposed to moisture, thereby reducing the physical properties of a material. In addition, defects may occur on the surface ligands weakly bound to the surfaces of nanoparticles or on the surfaces of the non-passivated nanoparticles due to solvents used in a process, thereby damaging the surface ligands or the surfaces of the nanoparticles. However, in the case of the method of patterning a nanoparticle thin film according to an embodiment of the present disclosure, by including the functional ligand in the functional photoresist 130, through a process of coating the nanoparticle thin film 110 with the photoresist, the functional ligand may be bound to the surfaces of the nanoparticles to passivate the nanoparticles, thereby improving the stability of the nanoparticle pattern 140.

Accordingly, by controlling the optical, photoelectric, electrical, electro-mechanical properties of the patterned nanoparticle pattern 140 fabricated using the functional photoresist 130 in the patterning process, the optical, photoelectric, electrical, and electro-mechanical properties of devices such as photodetectors (for detecting ultraviolet, visible, and infrared light), n-type transistors, and strain sensors may be easily improved.

More specifically, the functional ligand may control the electrical properties of the nanoparticles, and the electrical properties may include at least one of conductivity, bandgap, and free charge concentration.

Accordingly, when the functional ligand included in the functional photoresist 130 is bound (substitution) to the surfaces of the nanoparticles, in the case of the metal nanoparticle thin film 120, the conductivity of metal nanoparticles may be improved. In the case of a semiconductor nanoparticle thin film 120, the bandgap of semiconductor nanoparticles may be adjusted. In addition, due to formation of an extrinsic semiconductor (semiconductor whose properties are determined by addition of impurities), free charge concentration in a conduction band may be increased.

In addition, the conductivity of a nanoparticle thin film 120 may be improved by adjusting the distance between the metal nanoparticles, and the charge mobility of a transistor may be improved by increasing charge concentration through ion doping of the particle surface.

When the nanoparticle thin film 120 includes metal nanoparticles, the electrical resistance of the metal nanoparticle thin film 120 is dominated by hopping transport and may be proportional to the distance between the metal nanoparticles determined by the length of the ligands surrounding the metal nanoparticles.

Accordingly, when an inorganic ligand such as TBAB, TBAI, and TBAC is used as the functional ligand, due to the short length of the inorganic ligand, the distance between nanoparticles (e.g., quantum dots) is shortened to facilitate electron movement, thereby improving conductivity.

Conversely, when an inorganic ligand having a long length or an organic ligand is used as the functional ligand, due to the large distance between the nanoparticles, the nanoparticles may be electrically insulated and may exhibit insulating properties.

Accordingly, since conductivity is controlled according to the length of the functional ligand, a metal nanopattern 140 having insulating properties, the metal nanopattern 140 having a metal-insulator transition structure, or the metal nanopattern 140 having metal properties may be fabricated.

In addition, when an inorganic ligand such as $InCl_3$ is used as the functional ligand, by binding the inorganic ligand to the surfaces of the nanoparticles, ion doping may be performed.

More specifically, indium (In) has been known as an effective n-type dopant for a CdSe thin film 120 fabricated as a field effect transistor (FET). For indium (In) doping, an expensive, complicated, or time-consuming process such as thermal deposition or synthesis of indium (In) nanoparticles (NC) on the CdSe nanoparticle thin film 120 was required. However, in a functional photoresist 130 according to an embodiment of the present disclosure, patterning using the functional photoresist 130 including an indium (In) halide ligand may be performed, and at the same time, indium (In) doping may be performed.

Accordingly, through a simple process of applying the functional photoresist 130 on the CdSe thin film 120, an FET device having high electron mobility may be obtained through ligand substitution and indium (In) doping.

Accordingly, the functional ligand may include an inorganic ligand, and the inorganic ligand may include at least one of sulfur ions ($S^{2-}$), chlorine ions ($Cl^-$), bromine ions ($Br^-$), thiocyanate ions ($SCN^-$), iodine ions ($I^-$), disulfide ions ($HS^-$), tellurium ions ($Te^{2-}$), hydroxide ions ($OH^-$), boric tetrafluoride ions ($BF_4^-$), and hexafluorophosphate ions ($PF_6^-$). Preferably, the inorganic ligand includes at least one of $InCl_3$, tetrabutyl ammonium chloride (TBAC), tetrabutyl ammonium iodide (TBAI), and tetrabutyl ammonium bromide (TBAB).

In addition, in the case of using an inorganic ligand among the functional ligands, when substitution is performed with an $I^-$ ligand, compared to $Cl^-$ and $Br^-$, the inter-particle distance is relatively increased, and accordingly, the number of nano-cracks and pores in the nanoparticle thin film 120 is increased, thereby increasing resistivity. As a result, resistance change rate is increased and a gauge factor is also increased. Thus, it is preferably to use an $I^-$ ligand.

In addition, the functional ligand may control the optical properties of the nanoparticles, and the optical properties may include at least one of photoluminescence intensity, photoluminescence lifetime, and photoluminescence quantum yield (PLQY).

More specifically, indexes for evaluating the optical properties of nanoparticles (e.g., quantum dots) include photoluminescence properties of absorbing light with energy greater than a bandgap and re-emitting light corresponding to the bandgap, photoluminescence lifetime indicating duration of photoluminescence after receiving light, photoluminescence quantum yield (PLQY) representing the number of emitted photons versus the number of absorbed photons, and the like.

For example, an organic ligand including a thiol group may be used as the functional ligand. Since a thiol group has a property of strongly binding to the surfaces of the nanoparticles, the organic ligand including a thiol group bonded to the surfaces of nanoparticles (e.g., quantum dots) may protect the surfaces of the nanoparticles (surface passivation), thereby preventing deterioration of the above-described optical properties.

In addition, when the functional photoresist 130 is used, a vacancy serving as a trap site in a bandgap of the surface of nanoparticles (e.g., quantum dots) is passivated by the substituted functional ligand, which reduces the number of the trap sites. As a result, by reducing non-luminescent coupling of excitons, at least one of the optical properties (e.g., photoluminescence intensity and photoluminescence lifetime) of the nanoparticles may be increased.

The functional ligand may include an organic ligand, and the organic ligand may include at least one of 3-mercaptopropionic acid (MPA), 1,2-ethanedithiol (EDT), thioglycolic acid, ethylenediamine (EDA), benzenedithiol (BDT), pyridine, methanethiosulfonyl-galactoside (TGA), propanedithiol (PDT), ethylenediamine, and phenylenediamine.

In step S120 of coating with the functional photoresist 130 according to an embodiment of the present disclosure, coating is performed with the functional photoresist 130, and then heat drying (pre-baking) or drying under reduced pressure is performed. Thereafter, heating may be performed to form a photoresist film.

When heating is performed, volatile components, such as solvents, may be volatilized. In this case, the heating may be performed at a relatively low temperature of 70° C. to 100° C.

For example, after the nanoparticle thin film 120 is spin-coated with the functional photoresist 130 at a speed of 4000 rpm for 30 seconds or more, the nanoparticle thin film 120 may be heat-treated at 90° C. for 1 minute.

According to an embodiment, step S120 of coating with the functional photoresist 130 according to an embodiment of the present disclosure may further include step S121 of reacting a functional ligand with nanoparticles.

In step S121 of reacting a functional ligand with nanoparticles, when the nanoparticle thin film 120 coated with the functional photoresist 130 is left for a certain period of time, the functional ligand in the functional photoresist 130 may be bound to the surfaces of the nanoparticles in the nanoparticle thin film 120.

In step S121 of reacting a functional ligand with nanoparticles, reaction time may be from 1 minute to 3 minutes. When the reaction time is less than 1 minute, the functional ligand may not be sufficiently bound (substitution) to the surfaces of the nanoparticles. When the reaction time exceeds 3 minutes, agglomeration between the nanoparticles may occur, and eventually, the nanoparticle thin film 120 may be peeled off from the substrate 110, so that the performance of a device may be deteriorated.

In addition, in the nanoparticle pattern 140, the degree (amount) of ligand substitution of the nanoparticle thin film 120 by the functional photoresist 130 may be adjusted according to the reaction time.

According to an embodiment, the nanoparticles may include a surface ligand. In step S120 of coating with the functional photoresist 130, the surface ligand may be substituted with a functional ligand by the functional photoresist 130.

In general, nanoscale particles have very high surface energy, which causes the particles to agglomerate. To prevent such agglomeration, nanoparticles are synthesized so as to be surrounded by a surface ligand with a long chain including 8 to 18 carbon chains.

For example, when silver nanoparticles (Ag nanocrystals) are used as the nanoparticles, silver nanoparticles (Ag nanocrystals) are surrounded by a surface ligand such as oleate consisting of a long carbon chain.

However, in the case of nanoparticles surrounded by surface ligands with a long carbon chain, the distance between the nanoparticles due to the long carbon chain is increased.

Accordingly, movement of electrons is not smooth, and thus the nanoparticles do not exhibit electrical properties.

Accordingly, in the method of patterning a nanoparticle thin film according to an embodiment of the present disclosure, in a photolithography process for patterning the nanoparticle thin film 120, by coating the nanoparticle thin film 120 including nanoparticles surrounded by surface ligands having a long chain length with the functional photoresist 130 including a functional ligand, the surface organic ligands having a long chain length surrounding the surfaces of the nanoparticles are substituted with functional ligands (e.g., I$^-$ ligands) relatively shorter than the surface organic ligands, thereby reducing the distance between the nanoparticles. As a result, movement of charge may be facilitated, and conductivity and electrical properties may be improved.

That is, in the method of patterning a nanoparticle thin film according to an embodiment of the present disclosure, by using the functional photoresist 130, patterning and physical properties control of the nanoparticle thin film 120 may be simultaneously performed.

The method of patterning a nanoparticle thin film according to an embodiment of the present disclosure includes step S130 of exposing the functional photoresist 130 used for coating.

In step S130, the functional photoresist 130 is exposed using a mask (M) on which a target pattern is engraved. At this time, exposure may be performed by irradiating the mask (M) for forming a target pattern with ultraviolet light. When the functional photoresist 130 is irradiated with ultraviolet light, the chemical structure of the functional photoresist 130 at a portion irradiated with ultraviolet light may be changed, so that the portion may not be easily dissolved in a developer.

The method of patterning a nanoparticle thin film according to an embodiment of the present disclosure includes step S140 of developing the exposed functional photoresist 130 to form the functional photoresist pattern.

In step S140, the exposed functional photoresist 130 is developed using a developer. The functional photoresist pattern 131 may be formed by removing the functional photoresist 130 in a portion not irradiated with ultraviolet light except for a target pattern formed on the functional photoresist 130.

The method of patterning a nanoparticle thin film according to an embodiment of the present disclosure includes step S150 of forming the nanoparticle pattern 140 using the functional photoresist pattern 131 as an etching mask.

By performing etching using the functional photoresist pattern 131, the nanoparticle pattern 140 including the nanoparticles surrounded by the functional ligands may be formed.

The etching may be dry etching or wet etching.

In the method of patterning a nanoparticle thin film according to an embodiment of the present disclosure, since the functional photoresist 130 is used to pattern the nanoparticle thin film 120 while controlling physical properties, all processes may be performed at room temperature under normal pressure.

Comparative Example: Conventional PR

AZ GXR-601 was used as a photoresist.

Example 1-1: Thiol Ligand+PR(EDT)

An EDT ligand was dispersed in EtOH to prepare a 2 M ligand solution. 1 ml of the prepared ligand solution was added to 10 ml of a positive photoresist (Positive PR) and stirred at room temperature for 30 minutes under light-blocked conditions. The positive photoresist (Positive PR) contains 60 to 65% w/w of ethyl lactate, 10 to 15% w/w of n-butyl acetate, 1 to 5% w/w of diazonaphthoquinone ester, and 20 to 25% w/w of a Cresol novolac resin.

Example 1-2: Thiol Ligand+PR(MPA)

The same procedure as in Example 1-1 was performed, except that 3-mercaptopropionic acid (MPA) was used as the functional ligand.

Example 1-3: Thiol Ligand+PR(TGA)

The same procedure as in Example 1-1 was performed, except that thioglycolic acid (TGA) was used as the functional ligand.

Example 2-1: Strain Sensor

First, a PET substrate on which a self-assembly monolayer (SAM) was formed was spin-coated with silver nanoparticles (Ag NC) in a solution state at a speed of 2,000 rpm, and then a functional photoresist including a TBAC ligand was applied to the Ag thin film. Then, after ligand substitution reaction was performed for 2 minutes, spin coating was performed at a speed of 3,000 rpm. Then, after soft baking was performed at 90° C. for 60 seconds on a hot plate, exposure was performed for 12 seconds using an ultraviolet light (UV) exposure machine, and an operation part of a strain sensor was patterned through a metal mask.

The exposed substrate was developed using a developer (AZ-MIF 300K) for 40 seconds and washed with deionized water. Then, using an acid etchant containing deionized water, hydrochloric acid, and nitric acid in a ratio of 5:4.5:0.5, etching of the nanoparticle thin film was performed in a portion where the functional photoresist did not remain. Then, the remaining functional photoresist was removed with acetone (lift-off process) to fabricate an operation part of a strain sensor. The strain sensor was fabricated by applying silver paste to both ends of the operation part to form an electrode.

Example 2-2: Temperature Sensor

A temperature sensor was fabricated in the same manner as in Example 2-1.

Example 3-1: N-Type Transistor (N-type FET)

A SiO$_2$ substrate on which a self-assembly monolayer (SAM) was formed was spin-coated with CdSe nanoparticles (CdSe NC) in a solution state at a speed of 2,000 rpm, and then a functional photoresist including an $InCl_3$ ligand was applied to the CdSe thin film. Then, after ligand substitution reaction was performed for 2 minutes, spin coating was performed at a speed of 3,000 rpm.

Then, after soft baking was performed at 90° C. for 60 seconds on a hot plate, exposure was performed for 12 seconds using an ultraviolet light (UV) exposure machine, and a channel part of FET was patterned through a metal mask. The exposed substrate was developed for 40 seconds using a developer (AZ-MIF 300K) and washed with deionized water. Then, using an acid etchant, etching of the nanoparticle thin film was performed in a portion where the functional photoresist did not remain.

Then, the remaining functional photoresist was removed with acetone (lift-off process) to fabricate an FET channel. An n-type transistor (N-type FET) was fabricated by depositing an Al electrode with a thickness of 60 nm using thermal evaporation at both ends of an operation part.

Example 3-2: Photodetector (Vis, NIR Photodetector)

A $SiO_2$ substrate or a glass substrate on which an Au electrode fabricated by thermal evaporation was formed was spin-coated with PbS nanoparticles (PbS NC) in a solution state at a speed of 2,000 rpm. Then, a functional photoresist including the prepared $InCl_3$ ligand was applied onto the PbS thin film. Then, after performing ligand substitution reaction for 2 minutes, spin coating was performed at a speed of 3,000 rpm.

Then, after soft baking was performed at 90° C. for 60 seconds on a hot plate, exposure was performed for 12 seconds using an ultraviolet light (UV) exposure machine, and an active area of a photodetector was patterned through a metal mask.

The exposed substrate was developed for 40 seconds using a developer (AZ-MIF 300K) and washed with deionized water. Then, using an acid etchant, etching of the nanoparticle thin film was performed in a portion where the functional photoresist did not remain. Then, the remaining functional photoresist was removed with acetone (lift-off process) to fabricate an active area of a photodetector.

FIG. 3 includes scanning electron microscope (SEM) images of a nanoparticle pattern formed using a functional photoresist according to Example 1-2.

Referring to FIG. 3, in the case of the functional photoresist according to Example 1-2 of FIG. 3 of the present disclosure, by including an MPA functional ligand, a thin film may be patterned in various sizes and shapes.

FIG. 4 is a graph showing Fourier transform infrared spectra before (As-synthesized G.C.) and after (MPA+PR-treated G.C.) coating with a functional photoresist according to Example 1-2.

The graph line (black) of a nanoparticle thin film before coating with a functional photoresist (As-synthesized G.C.) according to Example 1-2 represents a nanoparticle thin film having a CdSe/ZnS giant coreshell (G.C) structure without any treatment, and the graph line (blue) of a nanoparticle thin film after coating with a functional photoresist (MPA+PR-treated G.C.) according to Example 1-2 represents a nanoparticle thin film obtained by applying a functional photoresist including an MPA ligand onto the nanoparticle thin film having a CdSe/ZnS giant coreshell (G.C) structure, performing ligand substitution, and performing removal with acetone.

Referring to FIG. 4, the nanoparticle thin film before coating with the functional photoresist (As-synthesized G.C.) according to Example 1-2 includes peaks corresponding to the C-H section existing at 2,900 cm-1. In the case of the nanoparticle thin film after coating with the functional photoresist (MPA+PR-treated G.C.) according to Example 1-2, since substitution was performed using a short organic ligand, most of the peaks corresponding to the C—H stretch existing at 2,900 cm-1 are not observed.

FIG. 5 is a graph showing PL intensities before and after coating with a photoresist according to a comparative example, FIG. 6 is a graph showing PL intensities before and after coating with a functional photoresist according to Example 1-1, FIG. 7 is a graph showing PL intensities before and after coating with a functional photoresist according to Example 1-2, and FIG. 8 is a graph showing PL intensities before and after coating with a functional photoresist according to Example 1-3.

FIG. 5 shows a case in which a conventional photoresist is used. When coating is performed with a photoresist according to a comparative example, and removal is performed using acetone, oleic acid ligands bound to the surfaces of nanoparticles (G.C particles) are easily removed by photoresist coating and acetone washing, which causes defects in a nanoparticle thin film (G.C. particle thin film). As a result, the PL intensity of the nanoparticle thin film is reduced.

Referring to FIGS. 6 to 8, when coating is performed using the functional photoresist according to Example 1-1, the functional photoresist according to Example 1-2, and the functional photoresist according to Example 1-3, respectively, and removal is performed using acetone, by using the functional photoresist, the functional ligand strongly protects the surfaces of the nanoparticles (G.C particles), so that the PL intensity is increased even when photolithography is performed.

FIG. 9 is a graph showing the current-voltage characteristics of a strain gauge sensor according to Example 2-1, and FIG. 10 is a graph showing resistance change cycles.

In FIGS. 9 and 10, E denotes applied strains, and the y-axis denotes a resistance change rate value at each strain.

Referring to FIGS. 9 and 10, in the strain sensor, as strain increases, the distance between the nanoparticles increases and resistance increases. In the strain gauge sensor according to Example 2-1, the performance of the strain sensor is improved by ligand substitution and patterning of a silver nanoparticle thin film using a functional photoresist.

FIG. 11 is a graph showing the current-voltage characteristics of a temperature sensor according to Example 2-2, and FIG. 12 is a graph showing resistance change cycles.

Referring to FIG. 11, since the Ag nanoparticle thin film substituted with a halide-based inorganic ligand has electron transport by a metallic transport mechanism, when temperature increases, movement of electrons is restricted due to phonon virbration, thereby increasing resistivity.

Referring to FIG. 12, in the cycle test, the temperature sensor according to Example 2-2 has a high resistance change rate at high temperatures of 300 K and 323 K.

FIG. 13 schematically illustrates an n-type transistor according to Example 3-1, and FIG. 14 is a graph showing the electronic properties of the n-type transistor according to Example 3-1.

FIG. 14 shows a hysteresis I-V curve in which a gate voltage is increased from −50 V to +50 V and then applied from +50 V to −50 V again. Referring to FIG. 14, since an n-type transistor according to Example 3-1 is an n-type transistor, almost no drain current flows at a negative voltage. At a positive voltage, as electron carriers form a channel in a nanoparticle pattern patterned with a functional photoresist, the amount of current rapidly increases.

FIG. 15 is a graph showing the current-voltage characteristics of a photodetector (Vis, NIR photodetector) according to Example 3-2 under visible light conditions (Optoelectronic property), and FIG. 16 is a graph showing current-voltage characteristics under near infrared light conditions (Optoelectronic property).

In FIG. 15, on-current is an I-V curve corresponding to current flowing between two electrodes by applying a voltage between two electrodes when the photodetector according to Example 3-2 is irradiated with visible light corresponding to 532 nm, and off-current is an I-V curve in a dark state without emitting light.

Referring to FIG. 15, when irradiated with visible light, the nanoparticles included in the nanoparticle pattern patterned using the functional photoresist absorb light, and electrons are excited. At this time, the generated charge carriers are extracted by applied voltage to increase the amount of current.

Like FIG. 15, FIG. 16 is a graph showing on and off-current when irradiated with near infrared light corresponding to 980 nm.

The present disclosure can provide a functional photoresist and a method of patterning a nanoparticle thin film using the same. According to an embodiment of the present disclosure, by including a functional ligand in a photoresist, a nanoparticle thin film can be patterned, and at the same time, the physical properties of nanoparticles can be controlled through ligand substitution of nanoparticles or control of surface chemistry.

In addition, the present disclosure can provide a functional photoresist and a method of patterning a nanoparticle thin film using the same. According to an embodiment of the present disclosure, by including a functional ligand in a photoresist, a nanoparticle thin film can be patterned, and at the same time, the surfaces of nanoparticles can be passivated.

Although the present disclosure has been described through limited examples and figures, the present disclosure is not intended to be limited to the examples. Those skilled in the art will appreciate that various modifications, additions, and substitutions are possible, without departing from the scope and spirit of the invention. Therefore, the scope of the present disclosure should not be limited by the embodiments, but should be determined by the following claims and equivalents to the following claims.

| [Description of Symbols] | | | |
|---|---|---|---|
| 101: | PHOTOACTIVE COMPOUND | 102: | FUNCTIONAL LIGAND |
| 103: | DISPERSION SOLVENT | 110: | SUBSTRATE |
| 120: | NANOPARTICLE THIN FILM | 130: | FUNCTIONAL PHOTORESIST |
| 131: | FUNCTIONAL PHOTORESIST PATTERN | | |
| 140: | NANOPARTICLE PATTERN | M: | MASK |

What is claimed is:

1. A functional photoresist for patterning a nanoparticle thin film comprising nanoparticles on a substate, comprising:
a photoactive compound; and
a functional ligand that is bound to surfaces of the nanoparticles and controls physical properties of the nanoparticles,
wherein the functional ligand has a concentration of 100 mM to 500 mM.

2. The functional photoresist according to claim 1, wherein the functional ligand adjusts a distance between the nanoparticles.

3. The functional photoresist according to claim 1, wherein the functional ligand comprises an organic ligand, and the organic ligand comprises at least one of 3-mercaptopropionic acid, 1,2-ethanedithiol, thioglycolic acid, ethylenediamine, benzenedithiol, pyridine, methanethiosulfonyl-galactoside, propanedithiol, and phenylenediamine.

4. The functional photoresist according to claim 1, wherein the functional ligand comprises an inorganic ligand, and the inorganic ligand comprises at least one of sulfur ions, chlorine ions, bromine ions, thiocyanate ions, iodine ions, disulfide ions, tellurium ions, hydroxide ions, boric tetrafluoride ions, and hexafluorophosphate ions.

5. A method of patterning a nanoparticle thin film, comprising:
forming a nanoparticle thin film comprising nanoparticles on a substrate;
coating with the functional photoresist according to claim 1;
exposing the functional photoresist used in the coating;
developing the exposed functional photoresist to form a functional photoresist pattern; and
forming a nanoparticle pattern using the functional photoresist pattern as an etching mask,
wherein the functional photoresist comprises a functional ligand that is bound to surfaces of the nanoparticles and controls physical properties of the nanoparticles.

6. The method according to claim 5, wherein the physical properties of the nanoparticles are electrical properties, and the electrical properties comprise at least one of conductivity, bandgap, and free charge concentration.

7. The method according to claim 5, wherein the physical properties of the nanoparticles are optical properties, and the optical properties comprise at least one of photoluminescence intensity, photoluminescence lifetime, and photoluminescence quantum yield.

8. The method according to claim 5, wherein the nanoparticles comprise a surface ligand, and in the coating, the surface ligand is substituted with the functional ligand by the functional photoresist.

9. The method according to claim 5, wherein the functional ligand comprises an organic ligand, and the organic ligand comprises at least one of 3-mercaptopropionic acid, 1,2-ethanedithiol, thioglycolic acid, ethylenediamine, benzenedithiol, pyridine, methanethiosulfonyl-galactoside, propanedithiol, and phenylenediamine.

10. The method according to claim 5, wherein the functional ligand comprises an inorganic ligand, and the inorganic ligand comprises at least one of sulfur ions, chlorine ions, bromine ions, thiocyanate ions, iodine ions, disulfide ions, tellurium ions, hydroxide ions, boric tetrafluoride ions, and hexafluorophosphate ions.

11. The functional photoresist according to claim 5, wherein the nanoparticles comprise at least one of metals, metal oxides, chalcogenides, and quantum dots.

* * * * *